US010393909B2

United States Patent
Sternberg

(10) Patent No.: US 10,393,909 B2
(45) Date of Patent: Aug. 27, 2019

(54) DIFFERENTIAL TARGET ANTENNA COUPLING ("DTAC") DATA CORRECTIONS

(71) Applicant: ARIZONA BOARD OF REGENTS ON BEHALF OF THE UNIVERSITY OF ARIZONA, Tucson, AZ (US)

(72) Inventor: Ben K. Sternberg, Tucson, AZ (US)

(73) Assignee: Arizona Board of Regents on Behalf of the University of Arizona, Tucson, AZ (US)

( * ) Notice: Subject to any disclaimer, the term of this patent is extended or adjusted under 35 U.S.C. 154(b) by 0 days.

(21) Appl. No.: 15/730,413

(22) Filed: Oct. 11, 2017

(65) Prior Publication Data

US 2018/0100943 A1    Apr. 12, 2018

Related U.S. Application Data

(60) Provisional application No. 62/406,620, filed on Oct. 11, 2016.

(51) Int. Cl.
| | |
|---|---|
| *G01V 3/38* | (2006.01) |
| *G01V 3/10* | (2006.01) |
| *G01R 23/02* | (2006.01) |
| *G01V 3/12* | (2006.01) |
| G01R 29/08 | (2006.01) |

(52) U.S. Cl.
CPC ............. *G01V 3/104* (2013.01); *G01R 23/02* (2013.01); *G01V 3/12* (2013.01); *G01V 3/38* (2013.01); *G01R 29/0892* (2013.01)

(58) Field of Classification Search
CPC ...... G01R 23/02; G01R 29/0892; G01V 3/12; G01V 3/38
See application file for complete search history.

(56) References Cited

U.S. PATENT DOCUMENTS

| | | | | |
|---|---|---|---|---|
| 4,710,708 A | * | 12/1987 | Rorden | ............ E21B 47/02224 |
| | | | | 324/207.26 |
| 5,652,519 A | * | 7/1997 | Warren | .................... G01V 3/06 |
| | | | | 324/339 |

(Continued)

OTHER PUBLICATIONS

Dvorak, Steven L., Ben K. Sternberg, 2002, Removal of Time-Varying Errors in Network-Analyzer Measurements: Signal Normalization and Test Results, Institution of Electrical Engineers (IEE) —Science, Measurement and Technology, vol. 149, No. 1, 31-36.

(Continued)

*Primary Examiner* — Patrick Assouad
*Assistant Examiner* — Demetrius R Pretlow
(74) *Attorney, Agent, or Firm* — Nguyen Tarbet

(57) ABSTRACT

The present invention features a unique system of interdependent methods to greatly improve data acquired via the Differential Target Antenna Coupling ("DTAC") method, which transmits electromagnetic ("EM") fields and measures the primary EM field and the secondary EM fields generated in subsurface targets. These new data correction techniques provide improvements, in orders of magnitude, to the measured DTAC response accuracy. This improvement allows for greater depth of investigation, improved target location, and enhanced target characteristics.

3 Claims, 8 Drawing Sheets

(56) References Cited

U.S. PATENT DOCUMENTS

| | | | | |
|---|---|---|---|---|
| 5,781,436 | A * | 7/1998 | Forgang | G01V 3/28 324/343 |
| 5,790,075 | A * | 8/1998 | Inugai | H01Q 1/1257 342/359 |
| 5,917,325 | A * | 6/1999 | Smith | G01V 15/00 175/45 |
| 6,285,190 | B1 * | 9/2001 | Brune | E21B 47/02 175/45 |
| 7,994,963 | B1 | 8/2011 | Sternberg et al. | |
| 8,878,519 | B2 | 11/2014 | Dvorak et al. | |
| 9,465,129 | B1 * | 10/2016 | Olsson | G01V 3/38 |
| 2002/0173914 | A1 * | 11/2002 | Zhang | G01V 3/28 702/7 |
| 2005/0140374 | A1 * | 6/2005 | Itskovich | G01V 3/28 324/339 |
| 2007/0007960 | A1 * | 1/2007 | King | G01R 33/5617 324/309 |
| 2008/0211507 | A1 * | 9/2008 | Zhdanov | G01V 3/28 324/333 |
| 2011/0095748 | A1 * | 4/2011 | Dvorak | G01V 3/104 324/76.39 |
| 2011/0181290 | A1 * | 7/2011 | Kuzmin | G01V 3/17 324/331 |
| 2012/0242342 | A1 * | 9/2012 | Rabinovich | G01V 3/28 324/338 |
| 2012/0293177 | A1 * | 11/2012 | Dodds | G01V 3/17 324/331 |
| 2015/0091577 | A1 * | 4/2015 | Donderici | E21B 47/02216 324/326 |
| 2015/0276402 | A1 * | 10/2015 | Grasser | G01C 15/06 702/150 |
| 2016/0141766 | A1 * | 5/2016 | Olsson | H01Q 7/00 343/728 |
| 2016/0178782 | A1 * | 6/2016 | Miles | G01V 3/16 324/339 |
| 2017/0160420 | A1 * | 6/2017 | Olsson | G01V 3/12 |

OTHER PUBLICATIONS

Dvorak, Steven L., Ben K. Sternberg, 2013, Analytical and Numerical Studies of a Differential Target Antenna Coupling Method for Sensing and Imaging Subsurface Targets [Horizontal Array], June, JEEG, 91-101.

Dvorak, Steven L., Ben K. Sternberg, 2014, Analytical Studies of the Vertical Array, Differential Target Antenna Coupling (DTAC) Method for Rapid Sensing and Imaging of Subsurface Targets, Journal of Applied Geophysics, 105, 34-49.

Feng, Wanjie, Ben K. Sternberg, 2017, Field Tests of the Vertical-Array Differential Target Antenna Coupling (DTAC) System, JEEG, 22, 2, 143-152.

Sternberg, Ben K., Steven L. Dvorak, 2002, Removal of Time-Varying Errors in Network-Analyzer Measurements: System Design, Institution of Electrical Engineers (IEE) —Science, Measurement and Technology, vol. 149, No. 1, 22-30.

Sternberg, Ben K., Steven L. Dvorak, 2013, Experimental Studies and Verification of a Differential Target Antenna Coupling Method for Sensing and Imaging Subsurface Targets [Horizontal Array], June, JEEG, 103-118.

Sternberg, Ben K., Wanjie Feng, Steven L. Dvorak, Richard D. Reavis, 2015, Experimental Studies and Verification of the Vertical Array, Differential Target Antenna Coupling (DTAC) Method for Rapid Sensing and Imaging of Subsurface Targets, JEEG, Jun. 2015, vol. 20, No. 2, 119-136.

Sternberg, Ben K., Wanjie Feng, Steven L. Dvorak, 2015, Numerical Studies and Potential Applications of the Vertical Array, Differential Target Antenna Coupling (DTAC) Method for Rapid Sensing and Imaging of Subsurface Targets, JEEG, Jun. 2015, vol. 20, No. 2, 137-151.

Mathematics Stack Exchange, 2014, Describe a sine wave of known frequency with only two points: http://math.stackexchange.com/questions/383887/.

* cited by examiner

| θ | Sin (θ) |
|---|---|
| 90.00000 | 1.00000 |
| 0.00000 | 0.00000 |
| 6.00000 | 0.10453 |
| 6.01000 | 0.10470 |

DIFFERENTIAL TARGET ANTENNA COUPLING ("DTAC") DATA CORRECTIONS

CROSS REFERENCE

This application claims priority to U.S. Patent Application No. 62/406,620, filed Oct. 11, 2016, the specification of which is incorporated herein in its entirety by reference.

FIELD OF THE INVENTION

The present invention relates to improving data obtained from employing the Differential Target Antenna Coupling ("DTAC") system for subsurface target detection.

BACKGROUND OF THE INVENTION

The present invention is a network of independent and/or interdependent methods to greatly improve data for the DTAC system disclosed in U.S. Pat. No. 8,878,519, which is fully incorporated hereafter. This new data correction system can provide improvements by orders of magnitude in the measured DTAC response accuracy, which allows for greater depth of investigation, improved target location, and enhanced target characteristics.

The DTAC system transmits electromagnetic ("EM") fields, typically in the range of Hz to kHz, and measures the primary EM field plus the secondary EM fields generated in subsurface targets. The DTAC system uses a reference frequency to define a unique null direction in the EM fields. The DTAC system then measures the EM fields at other frequencies in this null direction. This approach to EM geophysical surveying has many advantages over the current state of the art, including more robust measurements, higher sensitivity and resolution, and reduced sensitivity to surface interference.

EM subsurface detection and imaging systems include a transmitter antenna generating a primary EM field that propagates into the subsurface. A secondary EM field, which is induced as the primary EM field encounters resistivity variations in the subsurface environment, is measured by a receiver. The receiver measures various properties of the received EM field including an in-phase component and a quadrature component to determine the presence, location, depth size and electrical properties of a subsurface target. Application of the present data correction system to EM systems provides improvements in measured response accuracy, which allows for greater depth of investigation, improved target location and enhanced target characteristics.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

SUMMARY OF THE INVENTION

The present invention features a unique network of independent and/or interdependent methods to greatly improve data acquired via a subsurface image and detection system employing the Differential Target Antenna Coupling ("DTAC") method, which transmits electromagnetic ("EM") fields and measures the primary EM field and the secondary EM fields generated in subsurface targets. These new data correction methods provide improvements, by orders of magnitude, to the measured DTAC response accuracy. This improvement allows for greater depth of investigation, improved target location, and enhanced target characteristics. The data correction methods disclosed herein may be employed individually or in combination and include: Coil Orientation and Null Adjustment, Large-Coupling Absolute Calibration, Orthogonality Correction to Eliminate the Transmitter Primary Field, Precision Calibration Refinement, Simultaneous Calibration using an Offset Calibration Coil, Measurement Frame Background Removal, and Background-Geology and Surface-Clutter Reduction (FIG. 1).

One of the unique and inventive technical features of the present invention consists of a novel calibration technique, where the calibration coefficients are calculated based on minimizing changes in the orthogonality corrected field and the DTAC response. Without wishing to limit the invention to any theory or mechanism, it is believed that the technical feature of the present invention advantageously provides for greatly improved detection and resolution of subsurface targets. None of the presently known prior references or work has the unique inventive technical feature of the present invention.

BRIEF DESCRIPTION OF THE DRAWINGS

The features and advantages of the present invention will become apparent from a consideration of the following detailed description presented in connection with the accompanying drawings in which.

DETAILED DESCRIPTION OF THE INVENTION

Figure 1:
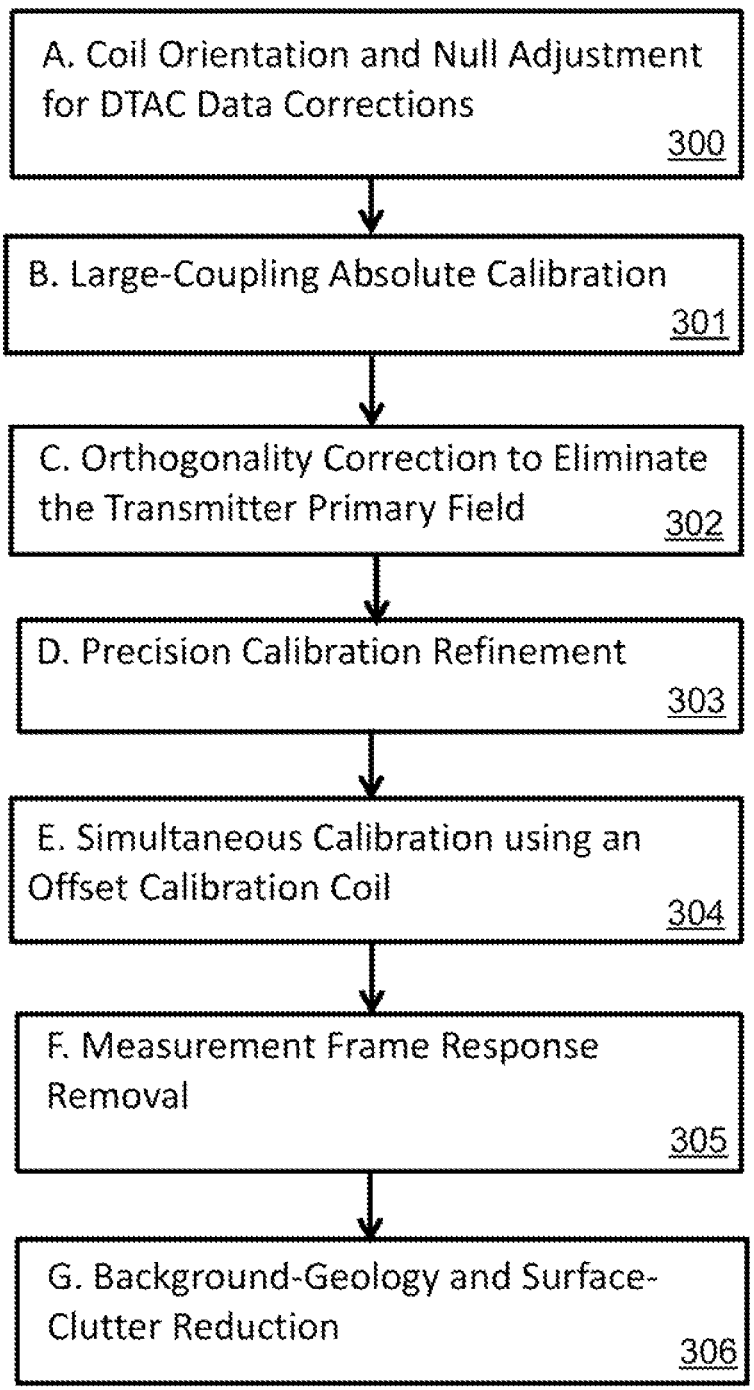
FIG. 1 shows a summary of the data correction methods disclosed herein.

Referring now to FIGS. 1-9B, the present invention features a method for reducing a primary EM field at a receiver antenna of a subsurface imaging and detection system to effectively enhance the dynamic range of a series of measurements of a target in a subsurface environment. In exemplary embodiments, the subsurface imaging and detection system employs differential target antenna coupling DTAC, and the present method is effective for providing DTAC data corrections to said system. In some embodiments, the present method comprises providing a tilt table (100) having: an x-axis linear adjustment (104) operatively connected to an x-axis receiver-coil (102), via a first point of attachment (106) (e.g., at one end of the x-axis receiver-coil (102)); and a y-axis linear adjustment (114), operatively connected to a y-axis receiver-coil (112) at a second point of attachment (116) (e.g., at one end of the y-axis receiver-coil (112)). In one embodiment, the x-axis linear adjustment (104) operates to pivot the x-axis receiver-coil (102) about a center point (110) on the x-axis linear adjustment (104). In another embodiment, the y-axis linear adjustment (114) operates to pivot the y-axis receiver-coil (112) about a center point (110) on the y-axis linear adjustment (104). As depicted in FIG. 1, said center points may be a common point (110).

In other embodiments, the linear motion control of the x-axis linear adjustment (104) and the y-axis linear adjustment (114) are motorized. In preferred embodiments, the x-axis linear adjustment (104) is positioned orthogonally to the y-axis linear adjustment (114). In further embodiments, the receiver antenna comprises the x-axis receiver-coil (102) and the y-axis receiver-coil (112).

In additional embodiments, the tilt table (100) is configured to tilt the x-axis receiver-coil (102) up and down via the x-axis linear adjustment (104) and configured to tilt the y-axis receiver-coil (112) up and down via the y-axis linear adjustment (114).

In supplementary embodiments, the method further comprises: calculating a null angle relative to a current orientation of the x-axis receiver-coil (102) and the y-axis receiver-coil (112); and adjusting the current orientation of the x-axis receiver-coil (102) and the y-axis receiver-coil (112) to reflect the null angle.

Consistent with previous embodiments, a primary EM field is transmitted by a transmitter-coil of the subsurface imaging and detection system into the subsurface environment. A secondary EM field is produced as a result of interactions between the primary EM field and said environment. The receiver antenna may then record a set of data values associated with the secondary EM field for a plurality of receiver antenna rotational directions and a plurality of received frequencies. Data values associated with the primary EM field may be integrated into the set of data values associated with the secondary EM field as a result of the presence of the primary EM field at the receiver antenna. In some embodiments, the tilt table (100) uses the null angle calculated for each of the plurality of receiver antenna rotational directions to adjust the current orientation of the x-axis receiver-coil (102) and the y-axis receiver-coil (112) to reflect the null angle. In this way, the x-axis receiver-coil (102) and the y-axis receiver-coil (112) are placed in a null-coupling orientation at each receiver antenna rotational direction. Thus, the presence of the primary EM field is effectively reduced at the receiver antenna.

It will be readily apparent to those skilled in the art that, where a coil orientation and null adjustment using the receiver coil has been previously described, the same null adjustment can be made by changing the coil orientation of the transmitter coil. In this way, said transmitter-coil is placed in an approximately null-coupling orientation for each receiver antenna rotational direction. This effectively reduces the presence of the primary EM field at the receiver antenna.

The present method further comprises a calibration of the x-axis receiver-coil (102) and the y-axis receiver-coil (112). This calibration comprises ensuring that the x-axis receiver-coil (102) and the y-axis receiver-coil (112) are aptly coupled to the transmitter-coil. Said apt coupling comprises shifting the orientation of the x-axis receiver-coil (102) and the y-axis receiver-coil (112) about 6° off the null-coupling orientation, while maintaining a coupling of the x-axis receiver-coil (102) and the y-axis receiver-coil (112), as well as a near-null coupling of the transmitter-coil with the x-axis receiver-coil (102) and y-axis receiver-coil (112).

Figure 2:
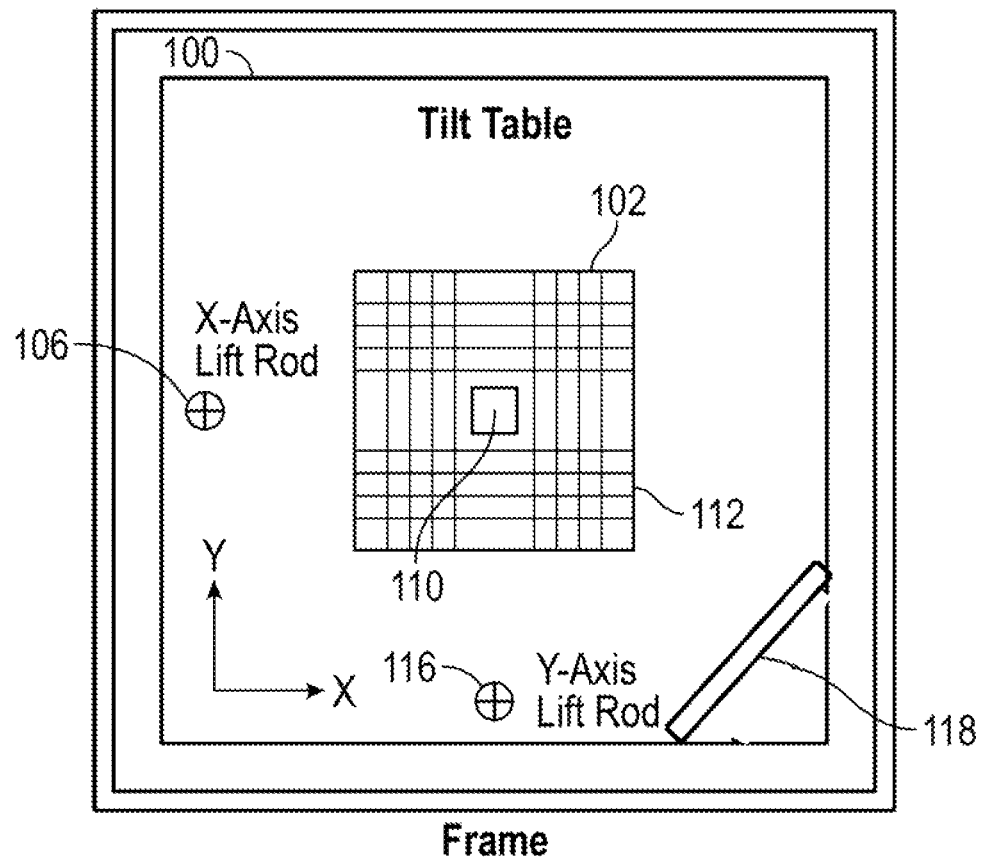
FIG. 2 shows an exemplary embodiment of the tilt table and system frame apparatus. The DTAC transmitter loop is located above, and centered over, this structure.
Figure 3:
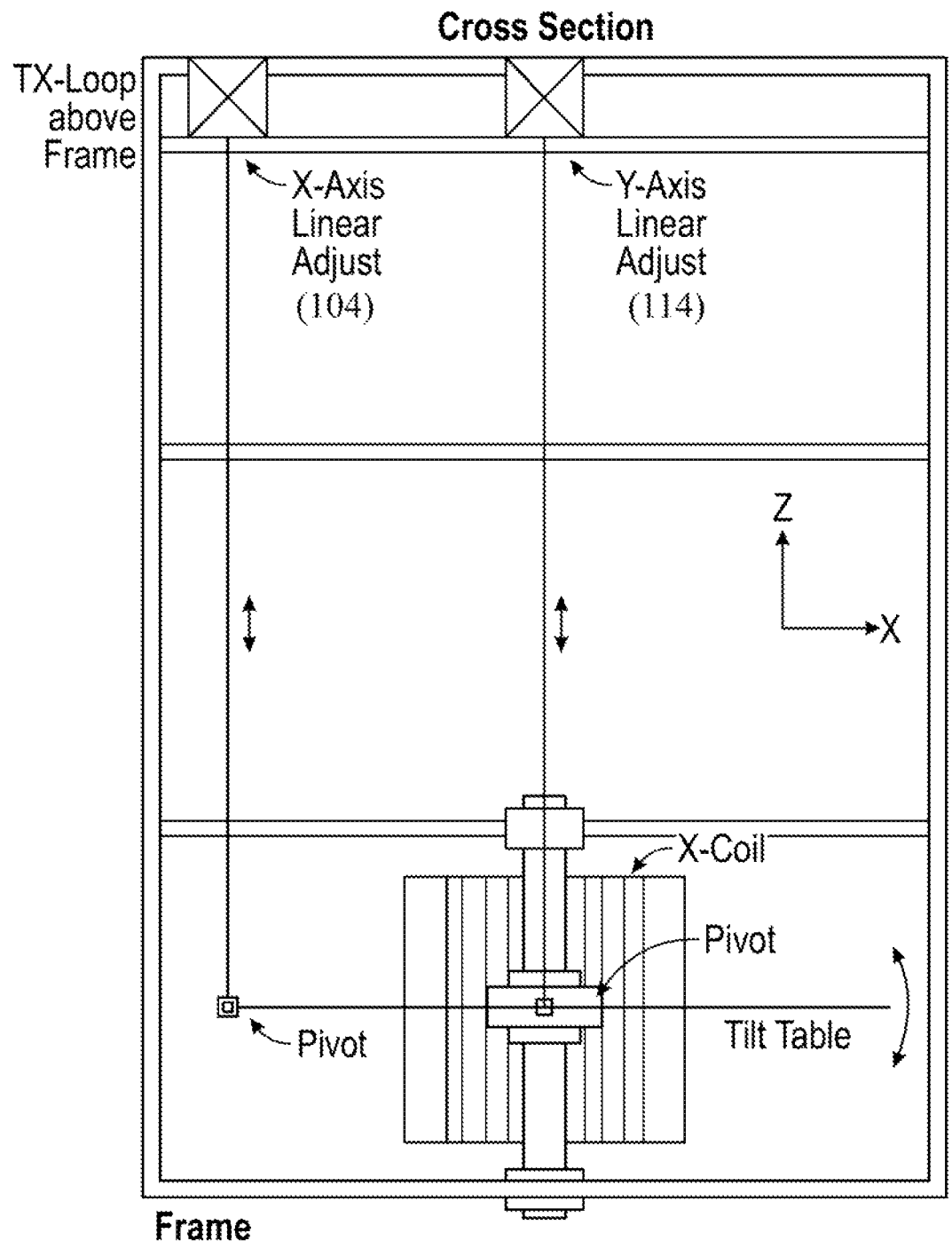
FIG. 3 shows a cross-sectional view of an exemplary embodiment of the tilt table and vertical-array DTAC system frame apparatus.

The present method may additionally comprise a method for monitoring changes in a receiver response for simultaneous calibration of the receiver, which is operatively coupled to the receiver antenna. In some embodiments, the method comprises: transmitting a calibrating signal into the x-axis receiver-coil (102) and the y-axis receiver-coil (112), where the calibrating signal is offset in frequency from the secondary EM field; and normalizing a set of received data signals of the secondary EM field by the calibrating signal, such that a change in the receiver response is removed. In other embodiments, a vertical calibration coil (118) is operatively coupled to the receiver for transmitting the calibrating signal. In a preferred embodiment, the vertical calibration coil (118) is at a 45 degree angle relative to the x-y axis of the tilt table (100) as seen in FIG. 2. In an embodiment, the vertical calibration coil (118) is offset from the x-axis and the y-axis receiver coils (102, 112). In another embodiment, a high output-impedance amplifier drives the vertical calibration coil (118) through a low-capacitance cable to eliminate changes in responses of the x-axis and the y-axis receiver coils (102, 112) caused by the vertical calibration coil (118).

The present invention also features a method for removing an influence of a primary EM field from a set of secondary EM field measurements to effectively enhance detection and analysis of a subsurface target by a subsurface imaging and detection system employing differential target antenna coupling DTAC. A secondary EM field may be produced as a result of interactions between the primary EM field and a subsurface environment. In some embodiments, the method comprises:

(a) selecting a reference frequency (200) from a plurality of received frequencies, wherein data at the reference frequency comprises a set of residual primary EM field data and a set of secondary EM field data;

(b) measuring a horizontal EM field component (201) of a secondary magnetic field at the reference frequency and measuring or calculating a vertical EM field component of an in-phase EM field at the reference frequency;

(c) calculating a present inclination angle of a receiver-coil, of the subsurface imaging and detection system, relative to the primary EM field at the reference frequency (202) using the horizontal EM field component of the in-phase EM field at the reference frequency and the vertical EM field component of the primary EM field at the reference frequency;

(d) computing an orthogonality correction angle (203), wherein the orthogonality correction angle is a mathematical difference between a present receiver-coil orientation angle and an orientation of the receiver-coil when the receiver-coil is orthogonal to the in-phase EM field;

(e) measuring a horizontal EM field component of an in-phase magnetic field and measuring or calculating a vertical EM field component of an in-phase magnetic field (204) at a first data frequency, where the first data frequency is one of the plurality of received frequencies;

(f) calculating a present inclination angle of the receiver-coil relative to the primary field at the first data frequency (205) using the horizontal EM field component of the in-phase EM field at the first data frequency and the vertical EM field component of the in-phase EM field at the first data frequency; and (g) computing an orthogonality corrected in-phase EM field (206) for the first data frequency using the orthogonality correction angle and the present inclination angle of the receiver-coil.

In exemplary embodiments, steps (a) through (g) above are repeated to obtain a corrected in-phase EM field for each of the plurality of received frequencies. In additional embodiments, each corrected in-phase EM field, comprising an in-phase response and a quadrature response, is calibrated by:

adjusting a magnitude, or a real part, of a gain response of a receiver until an in-phase component of the $B_x$ and $B_y$ orthogonality corrected field (where $B_x$ is the EM field component in the x-direction and $B_y$ is the EM field component in the y-direction) at an original primary EM field value and an in-phase component of the $B_x$ and $B_y$ orthogonality corrected field at a changed primary EM field value are equal, where the receiver is operatively coupled to the receiver-coil; and amending a phase, or an imaginary part, of the gain response of the receiver until a quadrature component of the $B_x$ and $B_y$ field at an original primary field value and a quadrature component of the $B_x$ and $B_y$ field at a changed primary field value are equal.

The present invention also comprises a method for removing a measurement-frame response of a subsurface imaging and detection system, employing DTAC, for improvement of subsurface target detection. In some embodiments, the method comprises: obtaining a first measurement of a magnetic field present at a receiver antenna of the subsurface imaging and detection system; and rotating said system 180 degrees to obtain a second measurement of the magnetic field present at the receiver antenna. Averaging of the first measurement of the magnetic field and the second measurement of the magnetic field yields the undesired frame response, which is then removed.

In another embodiment, each frame response is reduced to a lowest value, which is achieved when a number of metallic objects on the subsurface imaging and detection frame are minimized. In other embodiments, a position of the transmitter, the receiver, transmitter cables, and receiver cables remains the same when the first and second measurements are performed.

In additional embodiments, a measured background in-phase EM field value and a quadrature EM field value are selected based on geophysical or geological information. In preferred embodiments, the measured background in-phase EM field value and the quadrature EM field value are subtracted before calculating a DTAC response.

In supplementary embodiments, a varying background is calculated from one or more measured EM fields surrounding a postulated subsurface target. The varying background may be numerically found by fitting a set of data associated with a measured EM field away from, and on, one or more sides of the postulated subsurface target with a polynomial line or a polynomial surface. In exemplary embodiments, removal of the varying background effectively removes a background response of the subsurface imaging and detection system.

In an alternate embodiment, a single optimum local average background level, satisfying known subsurface target properties, is determined and utilized to remove the background response of the subsurface imaging and detection system. In yet another alternate embodiment, a known target having a near-zero DTAC response is used to determine a background response of said system for subsequent removal.

The following provides details for each data correction method, which may be employed individually or in combination to a subsurface image and detection system employing DTAC.

A. Coil Orientation and Null Adjustment for DTAC Data Corrections

A coil-orientation apparatus comprises the unique receiver-coil tilt table (100), which makes it feasible to efficiently and accurately accomplish DTAC data corrections of the subsurface imaging and detection system. The horizontal-plane transmitter loop may be disposed above the two receiver-coils (102,112). This configuration of the DTAC system is called the vertical-array DTAC system where, as previously mentioned, both receiver-coils (102, 112) pivot about a common center point (110) and the two high-speed, high-accuracy linear adjustments (104,114) are used to independently tip the two receiver-coils (102,112) up and down. The high resolution of the linear adjustments (104,114) allow the user to change the x-axis receiver-coil (102) and the y-axis receiver-coil (112) orientation by a precision angle θ, where θ=tan$^{-1}$(motorized linear adjustment motion distance/distance from the center-rotation point to the motorized linear adjustment point of attachment), for each receiver-coil (102,112). A computer algorithm can repeatedly adjust the orientation of the receiver-coils (102, 112) to minimize the output signals from the receiver-coils. This procedure significantly reduces the primary field EM from the transmitter-coil, thereby greatly improving the dynamic range of the measurement. In a further embodiment, the following procedure is used to identify the location of the null angle relative to the current orientation of the x-axis receiver-coil (102) and the y-axis receiver-coil (112). The received primary field EM signal amplitude follows a sine curve as the x-axis receiver-coil (102) and the y-axis receiver-coil (112) rotates to the null direction. Two measurements are made. From these two measurements, the amplitude and phase shift of the sine curve can then be calculated using the following equations, given the general equation: $f(t)=Y\sin(\omega t+\varphi)$, where ω is known and for two points $y_1=f(t_1)$ and $y_2=f(t_2)$ the solution is, $$Y = \frac{\sqrt{y_1^2 + y_2^2 - 2y_1 y_2 \cos(\omega(t_2 - t_1))}}{\sin(\omega(t_2 - t_1))}$$

$$\varphi = 2\pi - \tan^{-1}\left(\frac{y_2 \sin(\omega t_1) - y_1 \sin(\omega t_2)}{y_2 \cos(\omega t_1) - y_1 \cos(\omega t_2)}\right)$$

This angle, φ, is then used to calculate a null angle relative to a current orientation of the x-axis receiver-coil (102) and the y-axis receiver-coil (112) with very high accuracy. This null angle is calculated and the motorized linear adjustments (104,114) adjust the orientation of their respective receiver-coils (102,112) to reflect this angle. This calculation and adjustment may be performed repeatedly along the measurement profile to reduce the presence of the primary EM field at the receiver antenna.

B. Large-Coupling Absolute Calibration

In order to fully utilize the power of the vertical-array DTAC system, the x-axis receiver-coil (102) and the y-axis receiver-coil (112) should be calibrated to an absolute standard. Previously, the most effective method for this absolute calibration has been to rotate each receiver-coil (102,112) in turn so that it is in maximum coupling to the transmitter-coil (Sternberg et al., 2015a). Such a method accounts for all of the unknowns of the subsurface target identification system, including the transmitter response (where the transmitter-coil is coupled to the transmitter) and the receiver response (where the receiver antenna is coupled to the receiver). Unfortunately, this maximum coupling calibration requires physically removing the x-axis receiver-coil (102) and the y-axis receiver-coil (112) from their null-coupling orientation and moving them into maximum coupling with the transmitter-coil. Under any circumstances, this is not an efficient way to make a calibration. With the x-axis receiver-coil (102) and the y-axis receiver-coil (112) locked onto a platform (e.g., the tilt table (100)) that is adjusted with the two linear adjustments (104, 114), this procedure is not feasible. The linear adjustments (104, 114) can, however, adjust the x-axis receiver-coil (102) and the y-axis receiver-coil (112) orientation so that they measure a known percentage of the primary EM field. For example, Table 1 (FIG. 4) shows orientation angles of the receiver-coils (102,112) and the sine of those angles. The 90° case is the case where the x-axis receiver-coil (102) and the y-axis receiver-coil (112) are in maximum coupling with the transmitter-coil. This case can be used for an absolute calibration if the two receiver-coils (102, 112) can be conveniently moved into this position. The 0° case is the null-coupling orientation of the two receiver-coils (102,112). The 6° case is when a small shift of the x-axis receiver-coil (102) and the y-axis receiver-coil (112) is made off the null-coupling orientation. In this case, the primary EM field is only about 20 dB down from the maximum coupling case. In a frequency-domain system, with a closely spaced transmitter-coil and receiver-coil, this residual primary EM field is still many orders of magnitude above the secondary EM fields in the earth. Therefore, this signal provides an excellent means for calibrating the complete subsurface target detection system, which is independent of the background earth to a high degree of precision. An absolute orientation of the x-axis receiver-coil (102) and the y-axis receiver-coil (112) relative to the transmitter-coil is not needed for this calibration. The orientations of the receiver-coils (102,112) in Table 1 are relative to the null angle found by the dynamic-nulling procedure described earlier. If each motorized linear adjustment (104, 114) has a relative movement accuracy which leads to an angular error of no more than 0.01° (easily achieved with conventional motorized linear adjustments), then the variation in the calibration signal is about 2 parts per thousand, which provides a suitable accuracy for this absolute calibration. It is to be noted that an additional relative calibration with much higher accuracy is needed for the DTAC corrections, and this will be discussed later in this patent application. An apt coupling to the transmitter-coil occurs when the orientation of the receiver-coils (102, 112) are shifted 6° off of the null coupling-orientation. This small shift effectively maintains the large coupling of the x-axis receiver-coil (102) and the y-axis receiver-coil (112) as well as a near-null coupling of the receiver-coils (102, 112) with the transmitter-coil. When the large-coupling receiver response has been measured at a tilt angle of θ (close to 6° and referenced to the null dip angle), then the theoretical large-coupling primary field would be the free-space field calculated as shown in Sternberg et al., 2015a (Equation 1), times sin(θ). The magnitude of the measured large-coupling field is then matched to this value. The phase is 0°. This calibration can be performed in a very short time and can be repeated as often as needed.

C. Orthogonality Correction to Eliminate the Transmitter Primary Field

In EM subsurface detection and imaging systems, a primary EM field is transmitted by a transmitter-coil producing a secondary EM field as result of interactions between the primary EM field and the subsurface environment. A receiver antenna, comprising a receiver-coil, records a set of data values associated with the secondary EM field for a plurality of receiver antenna rotational directions and a plurality of received frequencies. Data values associated with the primary EM field are combined into the set of data values associated with the secondary EM field as a result of a presence of the primary EM field at the receiver antenna.

Figures 4, 5:
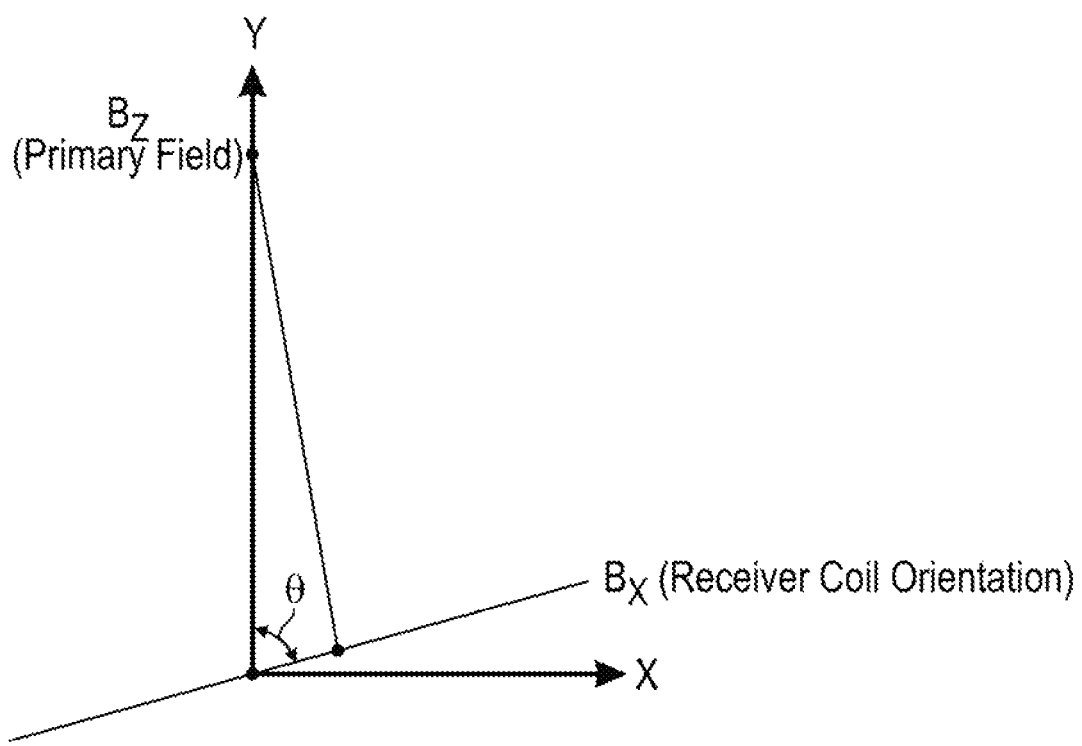
FIG. 4 shows a table of receiver-coil orientation angles and the sine of the angles.
FIG. 5 shows the orientation of EM field components used in orthogonality corrections.
Figure 6:
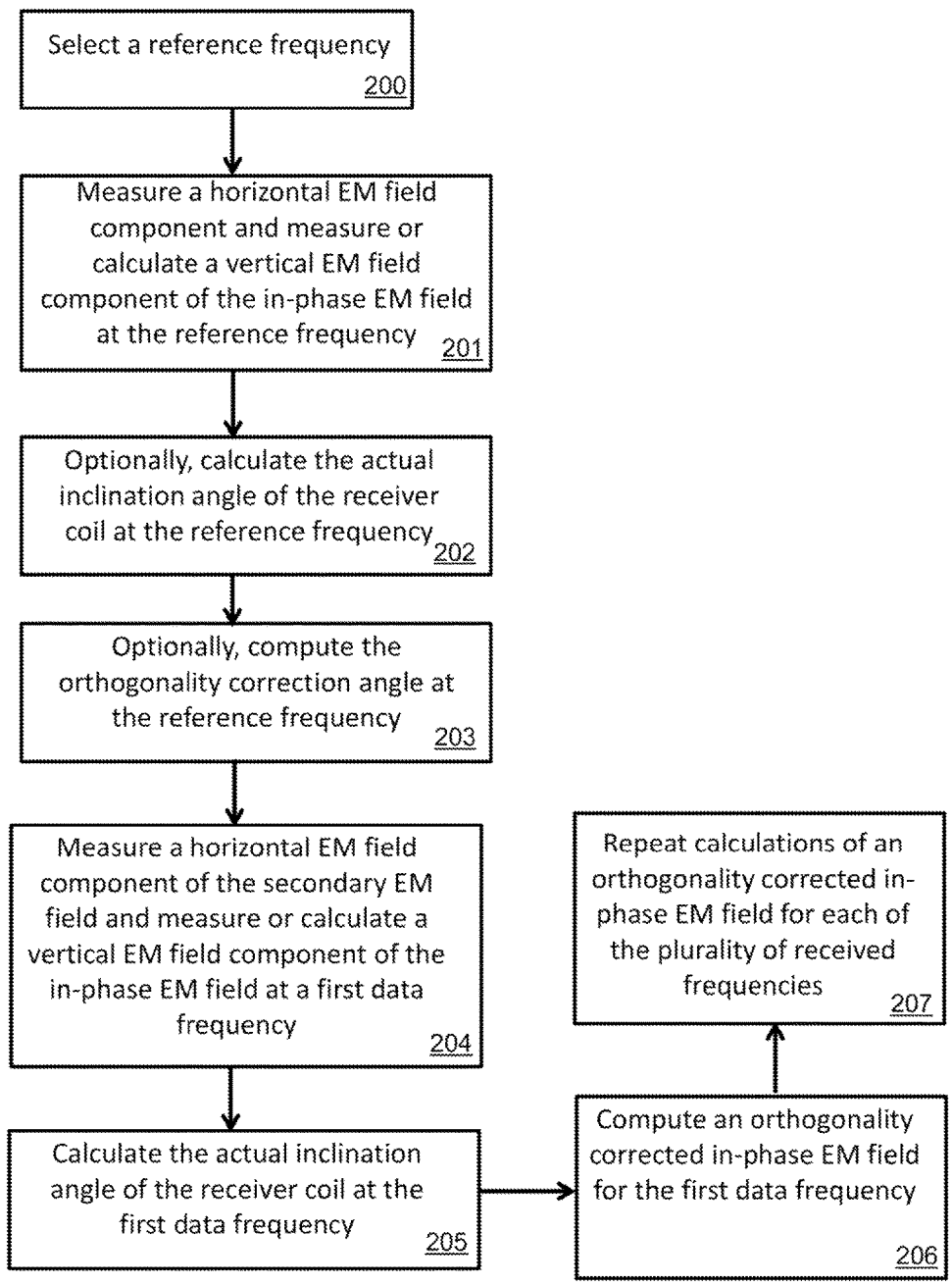
FIG. 6 shows a flow chart depicting an exemplary method for reducing a primary EM field in measured secondary EM field components.

Referring now to FIGS. 5-6, the present data correction system also comprises a method for removing a primary EM field from a set of total EM field measurements to effectively enhance detection and analysis of a subsurface target. Such method employs orthogonality corrections of measured EM fields. These corrections are used to remove changes in a primary EM field that occur during movement of a subsurface imaging and detection system. Orthogonality corrections are accomplished by calculating the angle that would effectively make the receiver-coil truly orthogonal to the total EM field (primary plus secondary EM field data are also in these calculations). The primary EM field, when normalized by a current at each of a plurality of received frequencies, is the same at each received frequency. However, the secondary EM field varies with frequency. By applying an orthogonality correction angle at each received frequency, the primary EM field is effectively eliminated, while changes in the secondary EM field information versus frequency are retained. The orthogonality corrections are applied to each individual total EM field component separately (e.g., $B_x$ and $B_y$).

Such method comprises selecting a reference frequency (200) from the plurality of received frequencies. The data at the reference frequency, $f_0$, will contain both residual primary EM field data as well as secondary EM field data. At $f_0$, a horizontal EM field component (201) of the secondary EM field is measured and a vertical EM field component of a primary EM field is measured or calculated. Only the in-phase component of the EM fields is used in the present calculations. Next, the present inclination angle, θ, of the receiver-coil relative to the primary EM field at $f_0$ is calculated using the horizontal EM field component, $B_x$, of the secondary EM field and the vertical EM field component, $B_z$, of the primary EM field at the reference frequency, $$\theta_0 = \cos^{-1}(B_x(f_0)/B_z(f_0)).$$

Further, an orthogonality correction angle (203) is computed. The orthogonality correction angle is the mathematical difference between a present receiver-coil orientation and an orientation of the receiver-coil when the receiver-coil is actually orthogonal to the primary EM field, $$90° - \theta_0.$$

The reference frequency may be a low frequency, with little secondary EM field data present. It may also be a high frequency, with substantial secondary EM field data present. In general, calculating multiple combinations of reference and data frequencies can lead to a rich data set that will aid modeling and interpretation of the target response.

The previous set of calculations are computed at the reference frequency, in an embodiment of the system, the next set of calculations are made at a first data frequency, $f_1$, and repeated for each received frequency of the plurality of received frequencies. A horizontal EM field component of a secondary EM field is measured while a vertical EM field component of a primary EM field is measured or calculated (204). Next, a present inclination angle of the receiver-coil relative to the primary EM field is calculated at the first data frequency (205) using the measured horizontal EM field component of the secondary EM field and the calculated vertical EM field component of the primary EM field, $$\theta_1 = \cos^{-1}(B_x(f_1)/B_z(f_1)).$$

The receiver-coil inclination angle at the reference frequency, $\theta_0$, is the same at each of the plurality of received frequencies, an orthogonality corrected secondary EM field may be calculated for the first data frequency using the orthogonality correction angle and the present inclination angle of the receiver-coil at the first data frequency (206) as follows, $$B_x(f_1) = \cos(\theta_1 + (90 - \theta_0)) * B_z(f_1).$$

As previously mentioned, the same calculations are repeated for each of the plurality of received frequencies to obtain a corrected secondary EM field at each frequency (207). This method is effective for the removal of the primary EM field while maintaining the varying secondary EM field.

This removal of the primary field by using the receiver-coil inclination angles at the reference frequency and the data frequencies is not the same as simply subtracting the reference-frequency magnetic field from the data-frequency EM fields. Under certain limiting circumstances, direct subtraction of the fields is approximately equal to subtraction of the orthogonality correcting angles. It is to be noted that the procedures outlined elsewhere in this patent application could be applied to data obtained from the orthogonality correction or the direct subtraction of the fields.

The use of a very-low-frequency measurement has been used in the past to subtract an approximation of the primary field from measurements at other frequencies. If this low frequency is low enough, so that the secondary fields from the targets of interest and the background geology are negligible, and if this low-frequency field is subtracted from the fields at other frequencies, then the data at the other frequencies can be compared directly with theoretically modeled data for interpretation. If there is some secondary field present at the reference frequency (as there often is), then the comparison with theoretically modeled data will not be valid.

In contrast, the orthogonality-correction reference frequency and the DTAC reference frequency are not restricted to a low frequency and no approximations are made. Any of the recorded frequencies may be chosen as the reference frequency. The reference frequency may have any amount of target and geology background response included in the data. The key to making it possible to quantitatively interpret these data is that the measured data and the theoretical model data are processed in exactly the same way. Since both measured data and model data are handled in the same way, the subsurface targets may be accurately modeled and interpreted. It is to be noted that the orthogonality corrected $B_x$ and $B_y$ data can be interpreted along with the DTAC data or they can be interpreted independently from the DTAC data.

The vertical field ($B_z$) data may be measured with the DTAC system. A horizontal coil may be placed at a location where the $B_z$ field is in null coupling to the transmitter loop, for example at a location that is offset from the center of the transmitter loop and below the plane of the transmitter loop. A frame holding the $B_z$ coil can be attached to the transmitter loop frame at the edge of the transmitter loop. The $B_z$ coil can be on a tilt table, which can be automatically adjusted for the deepest possible null. These data can then be processed with the orthogonality correction as described in the present section of the patent application. By recording this $B_z$ field, the homogeneous or layered geology background resistivity are able to be modeled.

D. Precision Calibration Refinement

An in-phase response and a quadrature response of an EM field associated with one of the plurality of received frequencies are first adjusted to effect a reduction of the primary EM field using the orthogonality correction. The orthogonality corrected EM field is comprised of an in-phase response and a quadrature response. The present data correction system further comprises an adjustment of the magnitude of a gain response of the receivers for the EM field components at each of the plurality of received frequencies. The adjustment is made until an in-phase component of the $B_x$ and $B_y$ orthogonality corrected field at an original primary field value and an in-phase component of the $B_x$ and $B_y$ orthogonality corrected field at a changed primary field value are equal. With the correct gain magnitude, the orthogonality corrected $B_x$ and $B_y$ fields do not change, regardless of the small change in the primary EM field. By making small adjustments in the gain magnitude, a true gain response may be found graphically. Selecting the value of these gains is done by manual adjustment of the gain using a slider bar. Or the process can be automated using a least squares algorithm, or other regression technique that would be known to one versed in the art, to find the correct gain coefficient that leads to zero change in the orthogonality corrected data at two or more levels of the primary EM field.

Further, a phase of the gain response of the receiver may be amended until a quadrature component of the $B_x$ and $B_y$ field at an original primary field value and a quadrature component of the $B_x$ and $B_y$ field at a changed primary field value are equal. Adjustment of the phase of the gain response of the receiver similarly comprises a manual adjustment of a vertical-array DTAC system via a slider bar or automated with a suitable least-squares fitting computer algorithm. Also, although it is convenient to use magnitude and phase for this method, real and imaginary components of the primary EM field may be used.

E. Simultaneous Calibration Using an Offset Calibration Coil

To accomplish additional calibration of the present data correction system further comprises a method to monitor changes in a receiver response in order to provide calibration of the receiver that is simultaneous with data correction. The simultaneous calibration monitors any changes in the receiver response after the initial absolute calibration and high-precision relative calibration.

This simultaneous calibration is based on the ARTTEST Calibration described in Sternberg and Dvorak, 2002 and Dvorak and Sternberg, 2002. The ARTTEST calibration was used in the early prototype DTAC system (Sternberg et al., 2015). However, modifications to the ARTTEST calibration are required in order to avoid cross-talk between the $B_x$ and $B_y$ coils, which occurs in the tightly coupled calibration and receiver-coils described in Steinberg et al., 2015, and these modifications will be described herein.

In one embodiment, such method comprises transmitting a calibrating signal into the x-axis receiver-coil (102) and the y-axis receiver-coil (112). The calibrating signal is at a very small level, relative to the magnitude of the primary EM field signal, and slightly offset in frequency from the primary EM field. Received data signals of the received EM field, are then normalized by the calibrating signal such that a receiver response change is removed. The receiver is coupled to a vertical coil (118) placed at a corner of the tilt table (100), (i.e., offset, or removed, from the receiver-coils) for transmission of the calibrating signal equally into both the x-axis receiver-coil (102) and the y-axis receiver-coil (112). The vertical calibration coil (118) may still be electromagnetically coupled to the two receiver-coils and thus produce cross-talk between the two receiver-coils. In order to avoid this, a high output-impedance amplifier (greater than 100 k-ohms) must be used to drive the vertical coil (118) through a very low capacitance cable to eliminate changes in responses of the x-axis and the y-axis receiver coils (102, 112). It is to be noted that the received data signals of the received EM field, are also normalized by a transmitter-loop current-monitor signal and an ARTTEST-calibration-loop current-monitor signal. This is necessary to remove any changes in both the transmitter current and the calibration current. These monitor signals are derived from the unique monitor circuits shown in FIGS. 9A-9B (labeled ARTTEST monitor and TX current monitor). If the current were simply monitored with a current shunt resistor, then the receiver signals and the current-monitor signals would not be isolated from each other. This will lead to severe cross-talk and significantly reduce the accuracy of the measurement. Furthermore, if a primary-field monitor loop is mounted near the transmitter loop, this may not accurately monitor the current in the transmitter loop because of changing coupling to the transmitter loop and changing secondary fields. Both the ARTTEST current-monitor loop and transmitter current-monitor loop are air-core coils, to avoid any non-linearity. These monitor loops are not current transformers, since they feed a high-impedance input. They are instead viewed as a small transmitter-coil coupled to a small receiver-coil. The TX current-monitor coil must be very well-shielded to avoid directly transmitting any spurious signal to the measurement frame and the receiver-coils.

F. Measurement Frame Response Removal

Any magnetic-field subsurface imaging and detection system response will consist of the desired subsurface target response, and the unwanted response from induced fields on metal components on the measuring frame, cross-talk between cables, and any radiated interference from other system components. For a high-power, deep penetrating, and high-resolution system, these measuring system or frame response fields must be removed with high precision. In the past, for ground-based EM systems, the instrument response has commonly been removed by making measurements in a target-free region. In practice, a target-free region may not exist. If there is some geologic response from even small heterogeneity in the earth, then all subsequent survey measurements may be limited in their usefulness. For airborne systems, it is possible to fly to very high elevations, where any effect from the earth is negligible. The time spent flying to these high elevations can impact the cost of the survey and is usually done only infrequently. The present invention features a system for removing a frame response of a subsurface imaging and detection system for improvement of subsurface target detection.

The present data correction system further comprises a method for removing the frame response of a subsurface imaging and detection system for improvement of subsurface target detection. The method described here is a modification and improvement over the procedure disclosed in U.S. Pat. No. 7,994,963. In one embodiment, a first measurement of a secondary EM field present at a receiver antenna of the subsurface imaging and detection system is obtained before rotating the subsurface imaging and detection system 180° and obtaining a second measurement of a secondary EM field present at the receiver antenna. In preferred embodiments, the first measurement and the second measurement are measured in exactly the same way. More specifically, the transmitter, the receiver, and the cables from the transmitter and the receiver to the coil frame are laid out in the exact same position for both the 0° and the 180° measurements.

In the subsurface imaging and detection system, a primary EM field is transmitted by a transmitter-coil and produces, as result of interactions with a subsurface environment, a secondary EM field. The receiver antenna receives and analyzes the secondary EM field to determine the presence, location, depth, size and electrical properties of a subsurface target. Interactions between one or more components of the subsurface imaging and detection system and the primary EM field may induce an undesired frame response. Averaging of the first measurement of the secondary EM field and the second measurement of the secondary EM field yields the undesired frame response, which is then removed. This procedure was used in Sternberg et al., 2015a, however, essential modifications to this procedure are required for high-accuracy measurements using the new high-power DTAC system and these modifications will be described herein.

It is not necessarily required to make the physical rotation between the two measurements 180° apart. The EM fields trace a sine wave as the rotation is performed. By using rotation points that are separated by 180°, the average of the two field measurements may be calculated to find the frame response, and the difference of the two field measurements may be calculated to find the geologic anomaly. It would be possible however, to record the secondary EM fields at other rotation angles and then calculate the EM fields at 0° and 180° using the known sine wave variation.

For ground-based measurements and high-power systems, it is necessary to have high-power generators, heavy transmitters and large tuning circuits moved off of the frame. In order to keep the cross-talk at a reasonable value, they must be located far enough away from the receiver-coils so that their effect on the received signal is below the receiver noise level.

To accomplish frame response removal for high-power measurements, the frame response must be exactly the same at the two measurements. This means that the frame, the feed lines to the transmitter circuit, the power generators, the data and reference frequency generators, the amplifiers (or the switching high-power circuits to generate large currents at the data and reference frequencies), and the tuning circuits, must be effectively in the same position and orientation, with respect to each other, for both the 0° and 180° measurements. This can be reliably accomplished because measurements are typically made along some profile line. The measurements at 0° and 180° are made by simply rotating the frame 180° on a fixed base plate, then moving the off-frame components to the opposite side of the frame.

In theory, when the frame components are rotated 180°, the frame response is unchanged. In practice, for a large measurement system, the coupling of the measuring system components to the electrically conductive earth may change the response at 0° and 180°. It is therefore necessary to reduce the frame response to the lowest possible values before the 0° and 180° measurements are applied. All metal on the frame, except for the transmitter and receiver cables, must be minimized. The frame must be an all non-metallic construction and control devices (such as for controlling the tilt-table dip) must be small and far from the receiver. Devices, such as the transmitter components, must be removed far from the measuring frame. The transmitting tuning circuit, for the frequencies used for geophysical mapping (of the order of Hz and kHz), must be shielded using, for example, multiple layers of thick steel or other shielding methods known to those versed in the art.

G. Background-Geology and Surface-Clutter Reduction

After the frame response is removed, the remaining response may consist of the desired target response plus slowly varying background-geology and surface-clutter (such as shallow buried utility lines and other surface conductors in contact with the ground). One way to address this issue is to include background-geology and surface-clutter, along with a target, in the numerical modeling of the measured DTAC data so that the entire earth is modeled in the survey area. In other words, the complex interaction between target and background effects are included in the model. Further embodiments of the present system address ways to directly estimate the background variation and remove slowly changing background variations along the profile.

In one embodiment, an in-phase EM field value and a quadrature EM field value, which is selected using additional and independent geophysical or geological information, can be used for background removal over a chosen interval. The measured background in-phase EM field value and the quadrature EM field value are subtracted from the remaining response of the subsurface imaging and detection system. In another embodiment, a varying background from one or more measured EM fields surrounding a postulated subsurface target is calculated. The varying background is found by numerically fitting a set of data associated with a measured EM field away from, and on, one or more sides of a subsurface target with a polynomial line or a polynomial surface. A further embodiment experimentally determines a single optimum local average background level satisfying known subsurface target properties, such as a symmetric response, along the measurement profile.

In another embodiment, a known highly conductive target, such as a metal sheet, is occasionally placed just above the surface near the DTAC measuring system. This metal sheet should have a near-zero imaging and detection DTAC response. A local background value is determined, which reduces the sheet DTAC response to the expected near-zero level. Such method provides an objective means to remove background-geology and surface-clutter fields and thereby remove their interaction with the target response. A tuned coil, which has a large $B_x$ and $B_y$ magnetic field response, but a very small DTAC response, with a switch that turns the coil on and off, may also be employed along a profile line. Each of the one or more aforementioned methods can isolate a varying background-response for removal from the desired subsurface target response.

Figure 7:
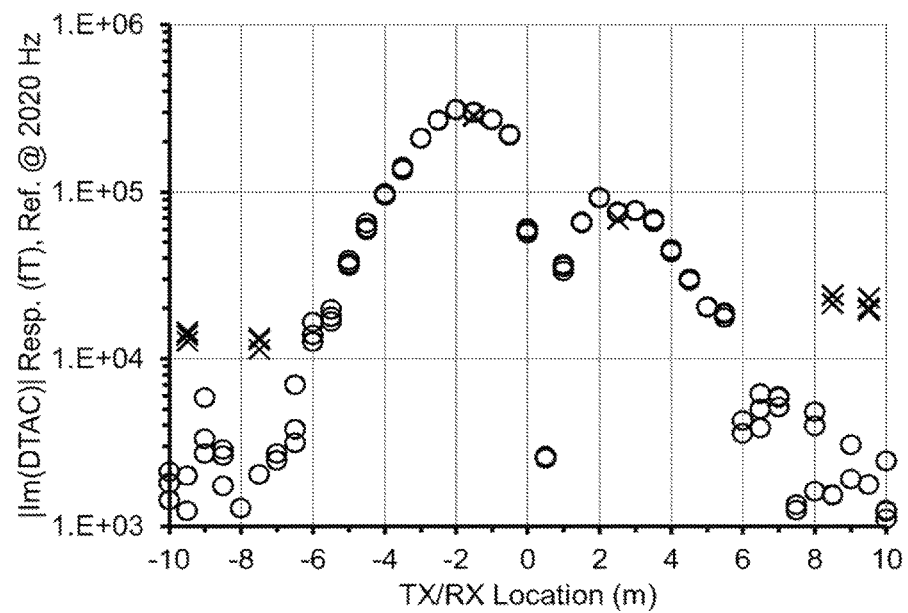
FIG. 7 shows an example of a profile across a buried sheet with no adjusted background.
Figure 8:
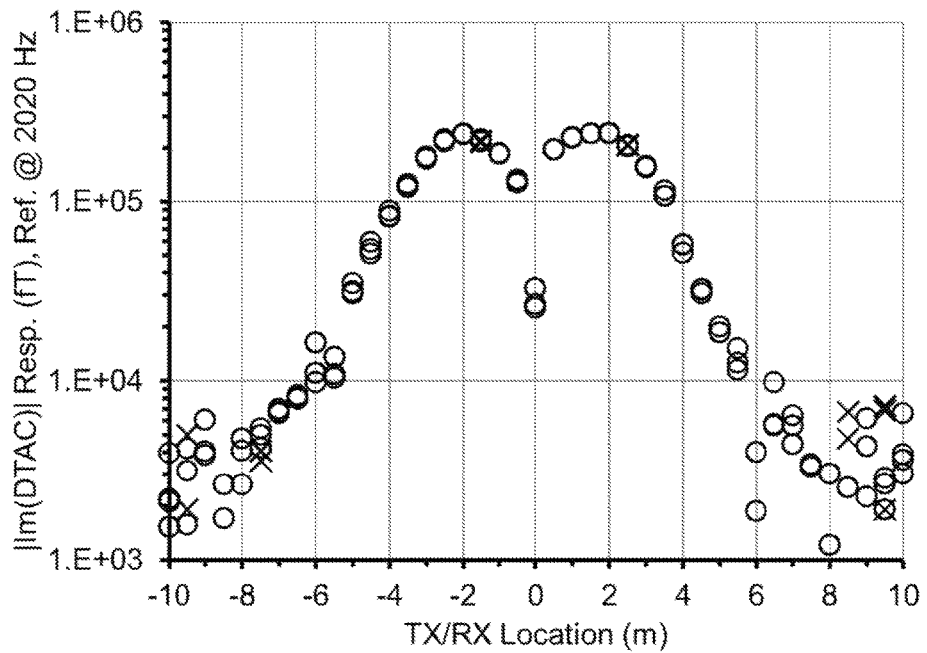
FIG. 8 shows an example of a profile across a buried sheet with adjusted background.

An example of this process is shown in FIG. 7 and FIG. 8. FIG. 7 is a profile across a buried aluminum sheet, which produced an asymmetric DTAC anomaly (circle symbols) due to the interaction of the target response and the background response. When a small aluminum sheet is temporarily placed just above the surface, this surface-sheet will produce a near-zero DTAC anomaly (X symbols). However, the surface-sheet anomaly is not near zero in this case because of the interaction of the surface-sheet response with the background response. When the background magnetic-field response ($B_x$, $B_y$, In-phase and Quadrature) is adjusted to minimize the added surface-sheet response (FIG. 8), then the buried-sheet response becomes symmetric, as it should be for this target. This provides a completely objective means to reduce the background effects, adjust the known response of the added surface-sheet to a near-zero DTAC response change, and then use the target response with this adjusted background value.

Note that the surface-sheet will have an effect on the $B_x$ and $B_y$ fields. Only the DTAC response will be small, which allows us to use this objective background removal method.

Figure 9A:
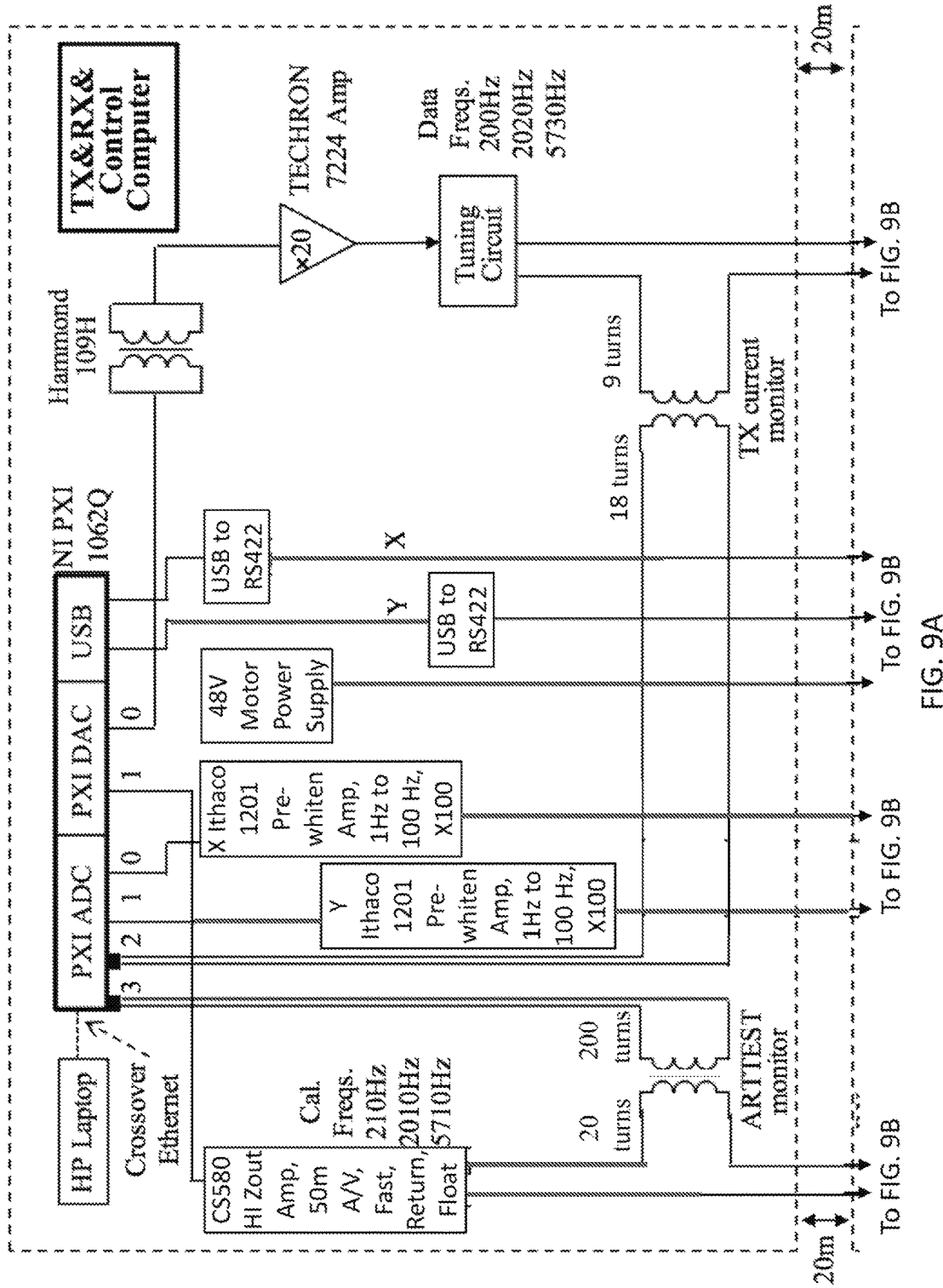
FIGS. 9A-9B show an embodiment of the present invention.
Figure 9B:
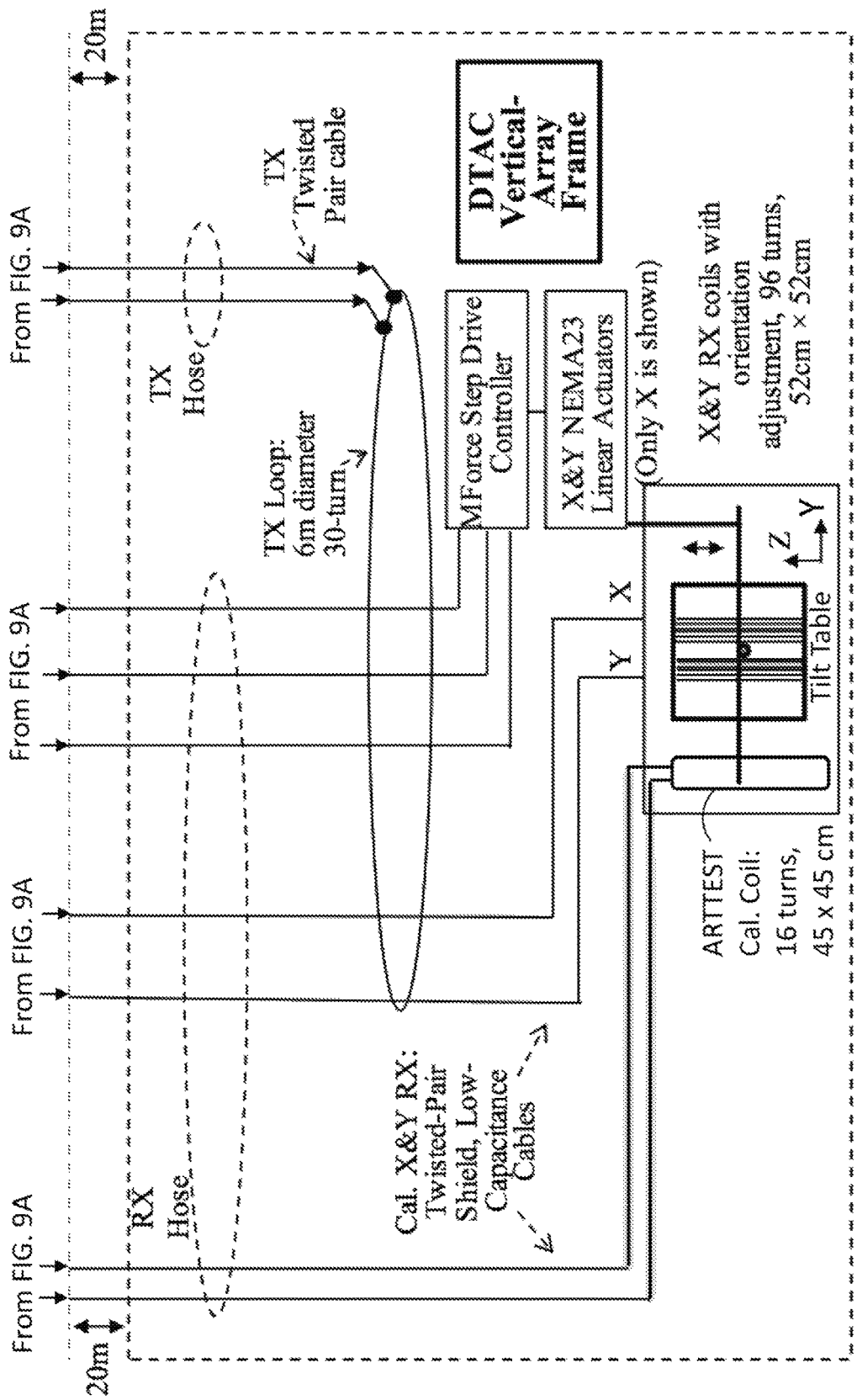

FIGS. 9A-9B show a detailed schematic of an embodiment of the transmitter/receiver set-up of the present invention.

As used herein, the term "approximately" refers to plus or minus 10% of the referenced number.

The disclosures of the following U.S. Patents are incorporated in their entirety by reference herein: U.S. Pat. Nos. 8,878,519 and 7,994,963.

Various modifications of the invention, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. Reference numbers recited in the claims are exemplary and for ease of review by the patent office only, and are not limiting in any way. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting of", and as such the written description requirement for claiming one or more embodiments of the present invention using the phrase "consisting of" is met. The reference numbers recited in the below claims are solely for ease of examination of this patent application, and are exemplary, and are not intended in any way to limit the scope of the claims to the particular features having the corresponding reference numbers in the drawings.

REFERENCES

Dvorak, Steven L., Ben K. Sternberg, 2002, Removal of Time-Varying Errors in Network-Analyzer Measurements: Signal Normalization and Test Results, Institution of Electrical Engineers (IEE)—Science, Measurement and Technology, Vol. 149, No. 1, 31-36.

Dvorak, Steven L., Ben K. Steinberg, 2013, Analytical and Numerical Studies of a Differential Target Antenna Coupling Method for Sensing and Imaging Subsurface Targets [Horizontal Array], June, JEEG, 103-118.

Dvorak, Steven L., Ben K. Sternberg, 2014a, Differential target antenna coupling (DTAC), U.S. Pat. No. 8,878,519.

Dvorak, Steven L., Ben K. Sternberg, 2014b, Analytical Studies of the Vertical Array, Differential Target Antenna Coupling (DTAC) Method for Rapid Sensing and Imaging of Subsurface Targets, Journal of Applied Geophysics, 105, 34-49.

Feng, Wanjie, Ben K. Sternberg, 2017. Field Tests of the Vertical-Array Differential Target Antenna Coupling (DTAC) System, JEEG, 22, 2, 143-152.

Sternberg, Ben K., Steven L. Dvorak, 2002, Removal of Time-Varying Errors in Network-Analyzer Measurements: System Design, Institution of Electrical Engineers (IEE)—Science, Measurement and Technology, Vol. 149, No. 1, 22-30.

Sternberg, Ben Kollock. Steven Louis Dvorak, Oleg Gennadyevich Krichenko, 2011, High-sensitivity subsurface sensing system, U.S. Pat. No. 7,994,963.

Sternberg, Ben K., Steven L. Dvorak, 2013, Experimental Studies and Verification of a Differential Target Antenna Coupling Method for Sensing and Imaging Subsurface Targets [Horizontal Array], June, JEEG, 91-101.

Sternberg, Ben K., Wanjie Feng, Steven L. Dvorak, Richard D. Reavis, 2015a, Experimental Studies and Verification of the Vertical Array, Differential Target Antenna Coupling (DTAC) Method for Rapid Sensing and Imaging of Subsurface Targets, JEEG, June 2015a, Vol. 20, No. 2, 119-136.

Steinberg, Ben K., Wanjie Feng, Steven L. Dvorak, 2015b, Numerical Studies and Potential Applications of the Vertical Array, Differential Target Antenna Coupling (DTAC) Method for Rapid Sensing and Imaging of Subsurface Targets, JEEG, June 2015, Vol. 20, No. 2, 137-151.

Mathematics Stack Exchange, 2014, Describe a sine wave of known frequency with only two points: http://math.stackexchange.com/questions/383887/.

What is claimed is:

1. A method for removing an influence of a primary electromagnetic ("EM") field from a set of secondary EM field measurements to enhance detection and analysis of a subsurface target by a subsurface imaging and detection system employing differential target antenna coupling ("DTAC"), wherein a secondary EM field is produced as a result of interactions between the primary EM field and a subsurface environment, the method comprising:

(a) selecting a reference frequency (200) from a plurality of received frequencies, wherein data at the reference frequency comprises a set of residual primary EM field data and a set of secondary EM field data;

(b) measuring a horizontal EM field component (201) of a secondary magnetic field at the reference frequency and measuring or calculating a vertical EM field component of an in-phase EM field at the reference frequency;

(c) computing an orthogonality correction angle (203), wherein the subsurface imaging and detection system has a receiver-coil, wherein the orthogonality correction angle is a mathematical difference between a present receiver-coil orientation angle and an orientation of the receiver-coil when the receiver-coil is orthogonal to the in-phase EM field;

(d) measuring a horizontal EM field component of an in-phase magnetic field and measuring or calculating a vertical EM field component of an in-phase magnetic field (204) at a first data frequency, where the first data frequency is one of the plurality of received frequencies;

(e) calculating a present inclination angle of the receiver-coil relative to the primary field at the first data frequency (205) using the horizontal EM field component of the in-phase EM field at the first data frequency and the vertical EM field component of the in-phase EM field at the first data frequency;

(f) computing an orthogonality corrected in-phase EM field (206) for the first data frequency using the orthogonality correction angle and the present inclination angle of the receiver-coil; and (g) repeating steps (a) through (f) to obtain a corrected in-phase EM field for each of the plurality of received frequencies, wherein the method is for removing the primary in-phase EM field while maintaining the secondary in-phase EM field as the primary in-phase EM field changes.

2. The method of claim 1, wherein each corrected in-phase EM field, comprising an in-phase response and a quadrature response, is calibrated by:

(a) adjusting a magnitude, or a real part, of a gain response of a receiver, operatively coupled to the receiver antenna, until an in-phase component of a $B_x$ and $B_y$ orthogonality corrected field at an original primary EM field value and an in-phase component of the $B_x$ and $B_y$ orthogonality corrected field at a changed primary EM field value are equal, where the receiver is operatively coupled to the receiver-coil; and (b) amending a phase, or an imaginary part, of the gain response of the receiver until a quadrature component of the $B_x$ and $B_y$ field at an original primary field value and a quadrature component of the $B_x$ and $B_y$ orthogonality corrected field at a changed primary field value are equal.

3. The method of claim 1 further comprising calculating the present inclination angle of the receiver-coil relative to the primary EM field at the reference frequency using the horizontal EM field component of the in-phase EM field at the reference frequency and the vertical EM field component of the primary EM field at the reference frequency.

* * * * *